United States Patent

Limberg

[15] 3,673,505

[45] June 27, 1972

[54] SYNCHRONOUS DEMODULATOR EMPLOYING A COMMON-BASE TRANSISTOR AMPLIFIER

[72] Inventor: Allen LeRoy Limberg, Somerville, N.J.

[73] Assignee: RCA Corporation

[22] Filed: Nov. 13, 1970

[21] Appl. No.: 89,273

[52] U.S. Cl. ...............................329/50, 307/232, 329/101, 330/30 D

[51] Int. Cl. ..............................................H03d 3/18

[58] Field of Search ...................329/50, 101, 103; 325/329, 325/330; 307/232, 235; 178/5.45 D

[56] References Cited

UNITED STATES PATENTS

| | | | |
|---|---|---|---|
| 3,178,651 | 4/1965 | Kegelman | 330/30 D X |
| 3,241,078 | 3/1966 | Jones | 329/101 X |
| 3,290,520 | 12/1966 | Wennik | 330/30 D X |
| 3,502,796 | 3/1970 | Hambley | 178/5.45 D |
| 3,512,096 | 5/1970 | Nagata et al. | 330/30 D X |
| 3,548,326 | 12/1970 | Bilotti | 329/101 X |
| 3,581,222 | 5/1971 | Dunwoodie | 329/101 X |

*Primary Examiner*—Alfred L. Brody
*Attorney*—Eugene M. Whitacre

[57] ABSTRACT

Input signals are coupled in common to the emitter electrodes of a pair of transistors arranged in a differential amplifier configuration, and are synchronously detected by switching signals coupled to the respective transistor base electrodes. The coupling to the emitter electrodes is through a transistor arranged in a common-base amplifier construction, with the signals to be demodulated being applied to the amplifier transistor emitter electrode via an included stabilizing resistor.

6 Claims, 5 Drawing Figures

PATENTED JUN 27 1972 3,673,505

Inventor:
ALLEN L.R. LIMBERG
BY Charles Brodsky
Attorney

SYNCHRONOUS DEMODULATOR EMPLOYING A COMMON-BASE TRANSISTOR AMPLIFIER

BACKGROUND OF THE INVENTION

1. Field of the Invention

This invention relates to synchronous demodulator constructions providing improved detector operation in the presence of large magnitude input signals.

2. Description of the Prior Art

Synchronous demodulators utilizing transistorized differential amplifiers have been described in the prior art. In one such configuration, input signals are coupled in common to the emitter electrodes of a transistorized differential pair and are synchronously detected by switching signals coupled to the respective transistor base electrodes. The coupling of the input signals to the common emitter electrodes is effected by means of a transistor amplifier having a base electrode to which the input signals to be detected are applied, a collector electrode connected to the common electrodes of the differential pair, and an emitter electrode coupled to a point of reference or ground potential by means of an added resistor.

A problem has been found to exist when the bias potential for the transistors of the differential pair is not very much larger than the bias potential for the coupling transistor. Large magnitude input signals saturate the coupling transistor amplifier such that its forward-biased base-collector junction reverse biases the differential transistors and produces pronounced shifts in the direct voltage component of the detected output signal. Such d-c shifts change the color balance in a reproduced television picture, for example, when the input signal to the transistor amplifier comprises a chrominance signal and the switching signal comprises the internally generated carrier developed by the 3.58 MHz reference oscillator of the receiver. The use of higher impedance drive to the base electrode of the transistor amplifier to reduce this forward-biasing was found undesirable because the bias stability of the demodulator tended to suffer.

Increasing the bias potential for the differential transistors is one way of reducing their reverse-biasing and the d-c shifts, but at the expense of the developable output signal swing for a fixed operating potential. Correspondingly increasing the operating potential is similarly undesirable because it increases the power dissipation of the system in which the demodulator is employed. This is especially unattractive when the system is fabricated as an integrated circuit having limited power handling capability.

Such over-driving of the input signal as will reverse-bias the differential transistors can occur when the demodulator is coupled to a chrominance amplifier having adjustable color control. A viewer may wish to vary the chrominance signal drive to increase the saturation of a reproduced image transmitted in pastel. When this input over-drive occurs, the d-c shift which results can change the relative control voltages applied to the color kinescope and vary the average background of the reproduced image. When a fully saturated scene is thereafter transmitted, the kinescope may well go into "-blooming."

SUMMARY OF THE INVENTION

As will become clear hereinafter, the synchronous demodulator of the invention is similar to the prior art arrangement as far as the switching section is concerned. It differs, however, in re-arranging the drive transistor to operate in its common-base mode. Input signals to be detected are applied to the emitter electrode of the coupling transistor through a stabilizing resistor comparable to that coupling the emitter electrode of the prior art transistor amplifier to ground. Positive-going input signals reverse-bias the common-base transistor just as negative-going input signals reverse-bias the amplifier transistor of the prior arrangement. Negative-going input signals, on the other hand, increase the amplifier current just as positive-going input signals do in the prior art arrangement. By biasing the base electrode of the common-base transistor with a potential less than that applied to the differential transistors, the demodulator output signals swing their entire range because the collector-base junction of the coupling transistor will not become forward-biased to reverse bias the switching transistors in the presence of overdriven input signals.

BRIEF DESCRIPTION OF THE DRAWINGS

These features of the invention will become apparent from a consideration of the following detailed description in which.

Figure 1:
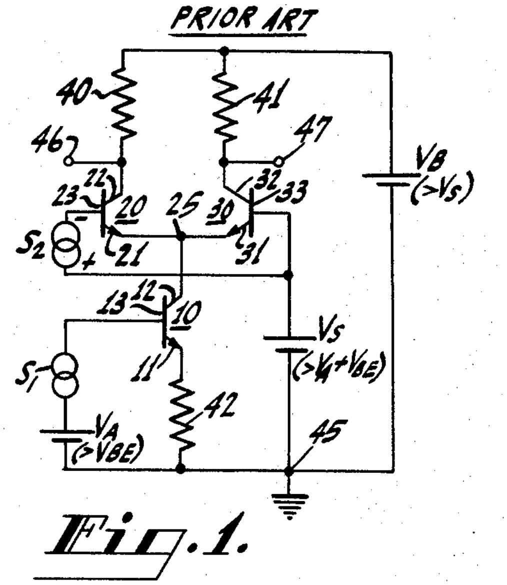
FIG. 1 shows a synchronous demodulator of the prior art type, and over which the present invention provides improved detector operation in the presence of large magnitude input signals.

Referring now to the prior art configuration of FIG. 1, the arrangement there shown includes first, second and third transistors 10, 20 and 30, and three resistors 40, 41 and 42. As indicated, the emitter electrodes 21, 31 of transistor 20, 30 respectively, are interconnected at junction point 25 which is, in turn, connected to the collector electrode 12 of transistor 10. Resistors 40 and 41 are included to respectively couple the collector electrodes 22 and 32 of transistors 20, 30 to a source of energizing potential $V_B$, equivalently represented as a battery along with the other potential sources illustrated herein. A similar source of energizing potential $V_S$ couples the base electrode 33 of transistor 30 to a point of reference or ground potential 45, to which one terminal of the sources $V_B$ and $V_S$ are each connected. Also coupled to the reference point 45 is one end of the resistor 42, the other end of which is connected to the emitter electrode 11 of transistor 10.

Input signals to be detected are supplied by a first signal source $S_1$ having one terminal connected to the base electrode 13 of transistor 10 and another terminal connected to a third potential source $V_A$, which is likewise referenced to ground potential as shown. A second source $S_2$ is included to provide reference switching signals for demodulating the applied input and for recovering its information, with the source $S_2$ being coupled between base electrodes 23, 33 of transistors 20 and 30, respectively. Push-pull output signals may be derived at a pair of output terminals 46, 47 coupled to the collector electrodes 22, 32 in known manner.

In such configuration, resistor 42 is selected of a value to provide substantial emitter resistance degeneration of transistor 10 so that the amplifier operation provided thereby is essentially linear. In a typical application of the arrangement of FIG. 1, the potential of the energizing source $V_A$ is selected larger than the base-to-emitter $V_{BE}$ offset voltage of transistor 10, while the value of the source $V_S$ is chosen larger than the value of the source $V_A$ by an amount at least equal to the base-to-emitter offset voltages of the transistors 20, 30. When the arrangement of FIG. 1 is constructed on a monolithic semiconductor substrate, the base-emitter offset voltages of transistors 20, 30 substantially equal that exhibited by transistor 10. Lastly, the value of the potential source $V_B$ is selected larger than the value of the potential source $V_S$.

Synchronous detection is obtained by switching the alternating input signal coupled to the base electrode 13 of transistor 10 from terminal 46 to terminal 47 on successive half cycles through the action of the switching transistors 20 and 30 in response to the alternating reference signals applied at their base electrodes 23, 33. Such reference signals are further described as being of a magnitude to switch transistors 20 and 30 completely "ON" or completely "OFF" while the input signals to be detected are of insufficient magnitude to turn transistor 10 fully "ON" or fully "OFF." Thus, for the case where the input signal applied to base electrode 13 and the reference signal applied to base electrode 23 are both positive with respect to ground, then transistors 10 and 20 will be turned towards their "ON" condition, to effectively connect output terminal 46 to the collector electrode 12 of transistor 10. This provides an output signal at terminal 46 indicative of the potential of collector 12 which will vary in accordance with the input signal applied by sources $S_1$. During the same half cycle, transistor 30 will be turned towards its "OFF" condition due to the differential action of transistors 20 and 30 and to the push-pull nature of the applied switching signal, and will hold the output terminal 47 at the positive potential of the energizing source $V_B$. On the next negative half cycle, the reference signal applied to base electrode 23 will turn transistor 20 "OFF" and turn transistor 30 "ON," to provide an output signal at terminal 47 indicative of the negative-going signal developed at the collector electrode 12 in response to the input signal applied to base electrode 13. Terminal 46 therefore receives the alternate positive half cycles of the applied input signals while terminal 47 receives the negative half cycles. For the illustrated case of the present drawings where the two signals are of opposite polarity, it will be appreciated that terminal 47 receives the positive-half cycles while terminal 46 receives the negative-half cycles.

The operation as thus far described procedes upon the implicit assumption that the bias source $V_S$ is substantially larger than the bias source $V_A$; with such assumption, the positive half cycles of large magnitude input signals applied to the base electrode 13 do not forward-bias the base-collector junction of transistor 10 to reverse bias transistors 20 and 30. If such reverse-bias should occur, the amount of detected information would be reduced and a direct-voltage shift would result at the output terminals 46, 47; in a color television receiver environment, such shift could raise the direct potentials coupled to the control electrodes of the color kinescope and cause a change in the average reproduced color to give the image a predominant cast or shading.

It will be readily apparent, however, that if the potential of the bias source $V_S$ were maintained sufficiently high to prevent this direct voltage shift, the magnitude of the output signals developed across the load resistors 40, 41 would be correspondingly reduced—unless the potential of the operating supply $V_B$ were increased. Increasing the supply potential is undesirable though, particularly in integrated circuit designs because of the increased power dissipation which results. It would be preferable if large magnitude output signals could be obtained with an arrangement in which transistors 20 and 30 are biased closely to ground potential. Merely, clamping the potential of base electrode 13 to prevent such forward-biasing of the base-collector junction of transistor 10 as will reverse-bias transistors 20 and 30 is therefore not a complete solution to the problem unless the bias potentials for those transistors 20, 30 are reduced as well.

Figure 2:
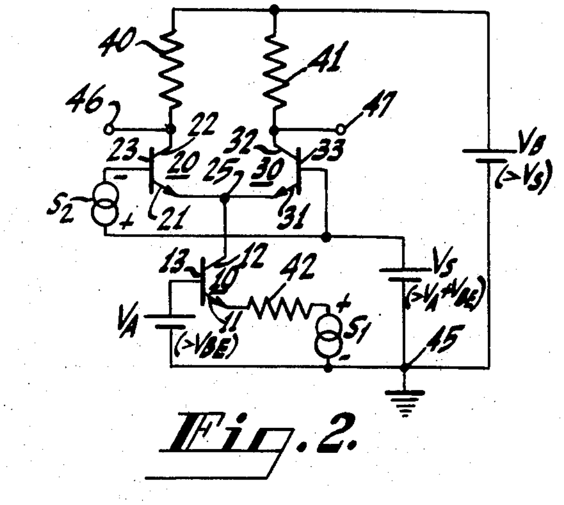
FIG. 2 shows a synchronous demodulator embodying the present invention.

The arrangement shown in FIG. 2 is a modification of that shown in FIG. 1 and employs the transistor 10 in its common-base mode of operation. The energizing source $V_A$ is coupled directly between the base electrode 13 of transistor 10 and the reference point 45, while the signal source $S_1$ is coupled between the reference point 45 and the emitter electrode 11 of transistor 10 by resistor 42. Input signals now swinging strongly positive can reverse-bias transistor 10 in much the same manner as strongly swinging negative signals reverse-bias transistor 10 in FIG. 1. Input signals swinging strongly negative in the arrangement of FIG. 2 can increase the current of transistor 10 just as strongly swinging positive signals increase the current of transistor 10 in FIG. 1. However, with the arrangement of FIG. 2, the base electrode 13 of transistor 10 is clamped at the potential $V_A$ even though the current through transistor 10 is increased with signal, as contrasted with the configuration of FIG. 1. Since the base-collector junction of transistor 10 with the FIG. 2 arrangement is prevented from becoming forward-biased, the detector transistors 20 or 30 are similarly prevented from becoming reverse-biased and, the detector output signals bottom normally instead of displaying the d-c shift typical of the FIG. 1 construction when large input signals are applied. As is indicated in the drawing, this result is achieved using an energizing source $V_A$ having a value only slightly larger than the $V_{BE}$ offset voltage of transistor 10.

Besides being attractive from the standpoint of stabilizing the direct voltage at output terminals 46, 47 for large input signals, the configuration of FIG. 2 offers another attractive feature for integrated circuit construction. It is oftentimes desirable to direct-couple the terminals 46, 47 to subsequent processing circuitry, in which case the voltages developed across resistors 40, 41 and 42 should be maintained substantially constant to obtain stability of operation. While it is not unduly difficult to match the resistance values of resistors incorporated within an integrated circuit chip to attain this objective, matching the resistance value of an integrated resistor with an external resistor presents some difficulties because of the many factors involved in controlling tolerances in integrated circuit fabrication. A problem would therefore arise if resistor 42 were an integrated component (as in the prior art construction of FIG. 1) while resistors 40 or 41 were discrete components connected external to the monolithic chip as part of a signal filter circuit. If resistor 42 were also available as an external discrete resistor, on the other hand, the task of matching would be easier. As will be readily apparent from the arrangement of FIG. 2, that terminal on the monolithic substrate required in such instance to couple resistor 42 as an external component could also serve as the terminal by which the input signals are coupled from source $S_1$ to the transistor 10. However, if resistor 42 were selected as an external component in the circuit of FIG. 1, it will be seen that two terminals on the integrated chip would be used, one for coupling the emitter electrode 11 of transistor 10 to the resistor 42 and one for coupling the source $S_1$ to the base electrode 13. The circuit of FIG. 2 would thus utilize one less terminal on an integrated circuit chip than would the construction of FIG. 1 for direct-current coupling arrangements.

Figure 3:
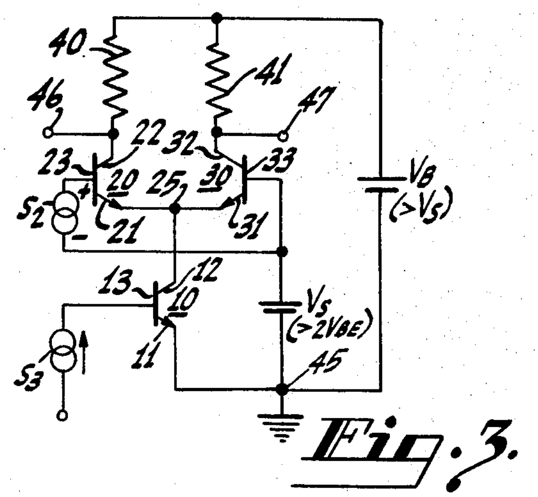
FIG. 3 shows a synchronous demodulator employing base-emitter clamping of an input coupling transistor utilizing current drive in its operation.

The construction of FIG. 3 is a modification of that shown in FIG. 2 in that the resistor 42 and bias source $V_A$ are each omitted, with a direct connection serving to couple the emitter electrode 11 of transistor 10 to the reference point 45 and with a current source $S_3$ connected to provide the input signal directly to the base electrode 13 of transistor 10. In this arrangement, the clamping of the base electrode 13 is effected by the internal base-emitter junction of transistor 10 as the emitter electrode 11 is connected to the ground point 45. Such clamping thus prevents the base electrode 13 from rising more than one $V_{BE}$ volts above ground. Here, too, the base-collector junction of transistor 10 cannot become forward-biased so as to reverse-bias the transistor switches 20, 30 for large amplitude input signals.

The circuit of FIG. 3 is also desirable in that the arrangement utilizes less of the available operating potential supplied because of the absence of the bias source $V_A$ and because the value of the source $V_S$ need exceed a level only equal to two $V_{BE}$ volts to forward-bias transistors 20 and 30 rather than exceeding the value $V_A + V_{BE}$ as in the construction of FIG. 1. Thus, a savings is effected not only in the biasing of the amplifier transistor 10, but also in the biasing of the switching transistors 20 and 30. Although indicated in the drawing as being generally operable with $V_S$ potentials in excess of two $V_{BE}$ volts, it will be understood that the arrangement of FIG. 3 is of greatest advantage when $V_S$ is in the voltage range of two-to-three $V_{BE}$ volts.

Figure 4:
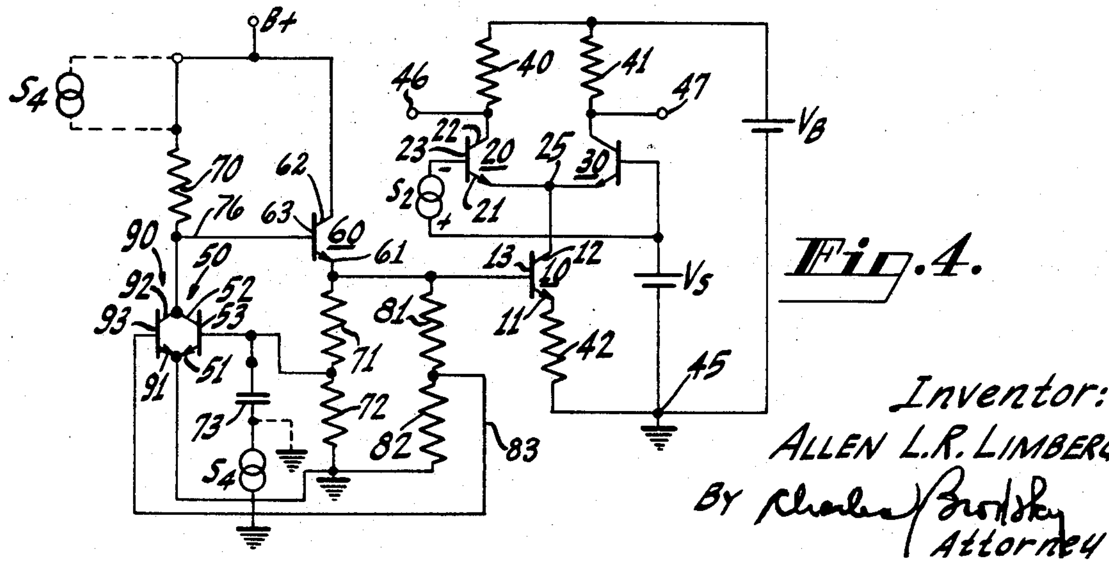
FIG. 4 shows a synchronous demodulator employing base-emitter clamping of an input coupling transistor and utilizing voltage drive in its operation.

The arrangement of FIG. 4 illustrates a second construction for clamping the voltage at the base electrode 13 of transistor 10, but uses a clamping technique external to the transistor 10 which is shown in its common-emitter configuration as in FIG. 1. In FIG. 4, transistors 50 and 60 and resistors 70, 71 and 72 form an amplifier construction along with an input capacitor 73 and a signal source $S_4$ similar to that described in my pending U.S. application Ser. No. 680,483, filed Nov. 3, 1967, now U.S. Pat. No. 3,555,309 and assigned to the same assignee as the invention of the present disclosure. In such construction, the collector electrode 62 of transistor 60 is directly connected to a source of operating potential B+, while its emitter electrode 61 is serially coupled to ground through resistors 71, 72. The junction between these two resistors is directly connected to the base electrode 53 of transistor 50, the emitter electrode 51 of which is directly connected to the ground point while the collector electrode 52 of which is coupled to the B+ operating potential supply through resistor 70. The base electrode 63 of transistor 60 is directly connected by a lead 76 to the collector electrode 52 of transistor 50 such that with the resistance value of resistor 71 chosen "$n$" times the resistance value of resistor 72, a direct potential is developed at the emitter electrode 61 of transistor 60 in the absence of signal equal to $(n+1)\ V_{BE}$, where $V_{BE}$ is previously defined as the offset voltage of a transistor operating in an amplifier condition. Lastly, the capacitor 73 is shown coupling the signal source $S_4$ to the base electrode 53 of transistor 50.

Such amplifier is further modified through the use of two additional resistors 81, 82 and a further transistor 90. As indicated, resistors 81 and 82 serially couple the emitter electrode 61 of transistor 60 to ground, with the junction between these resistors being directly connected by a lead 83 to the base electrode 93 of transistor 90. The emitter electrode 91 of transistor 90 is shown connected to the emitter electrode 51 of transistor 50, while the collector electrode 92 of transistor 90 is similarly connected to the collector electrode 52 of transistor 50.

With the quiescent potential at the emitter electrode 61 of transistor 60 constrained to be $(n+1)\ V_{BE}$ volts, the corresponding quiescent potential at the emitter electrode 11 of transistor 10 will be constrained to $nV_{BE}$ volts. A signal swing at the emitter electrode 11 which would reach ground potential on the negative excursion would thus define the signal swing to be of a $2nV_{BE}$ peak-to-peak value so that the positive excursion at the base electrode 13 of transistor 10 would then need to be constrained to a $(2n+1)\ V_{BE}$ volts value. Such will exist in the FIG. 4 circuit by selecting the resistance value of resistor 81 to be "$2n$" times the resistance value of the resistor 82.

That is, it can be shown that in the absence of signal, the voltage developed at the base electrode 53 of transistor 50 is of a value equal to one $V_{BE}$ volts, while the voltage applied to the base electrode 93 of the transistor 90 is of a value less than that amount so that the transistor 90 is non-conducting. Application of input signals from the source $S_4$ then results in amplification within the circuit loop including the base-collector junction of transistor 50, the lead 76, the base-emitter junction of transistor 60 and the resistor 71 to provide amplified output signals at the emitter electrode 61 of transistor 60. When the applied signal increases the voltage at the emitter electrode 61 to a level equal to $(2n+1)V_{BE}$ volts, the coupling through resistors 81 and 82 and lead 83 to the base electrode 93 of transistor 90 is sufficient to render that transistor conductive. The network including resistors 71 and 72 is thereafter bypassed by transistor 90 for signal and the d-c stabilization feature previously afforded by the amplifier configuration is now provided by the combination of resistors 81 and 82 and the transistor 90. The output swing is thus constrained to the $(2n+1)\ V_{BE}$ volt value, whereas without such added resistors 81 and 82 and transistor 90, the voltage at the emitter electrode 61 of transistor 60 would be within one $V_{BE}$ of the voltage at the collector electrode 52 of transistor 50—which is normally much larger than the multiple $V_{BE}$ ratio provided by the stage. Such voltage will thus be of a magnitude to forward bias the base-collector junction of transistor 10 and produce the bottoming problem outlined above. With the components 81, 82 and 90, however, the clamping that results reduces the tendency of the transistors 20, 30 to reverse bias on large magnitude input signal swings because the base-collector junction of transistor 10 is prevented from forward biasing.

The configuration comprising transistors 10, 50, 60, 90, resistors 42, 70, 71, 72, 81 and 82 and capacitor 73 will—with the proper selection of the ratios of resistances of resistors 71 and 72 and of resistors 81 and 82—function as a limiter having any desired symmetry or assymmetry of limiting characteristic. This limiter does not depend upon the saturation of any transistor in order to secure its limiter characteristic and, therefore, this limiter will not cause unwanted delay for signal transitions in one direction of potential swing as compared to the other. Such limiter stage is additionally advantageous when incorporated in a modified construction where the signal source $S_4$ is coupled between the resistor 70 and the B+ source of energizing potential, with capacitor 73 being returned directly to ground (as shown by the dotted lines of FIG. 4). Such modification is also shown in my Ser. No. 680,483 application to provide translation of the quiescent component of signal currents from a higher potential to a lower one. The limiter circuit herein described thus permits the output transistor 10 of the limiter to be biased close to ground potential, to enable easy coupling to a subsequent stage of signal processing.

Figure 5:
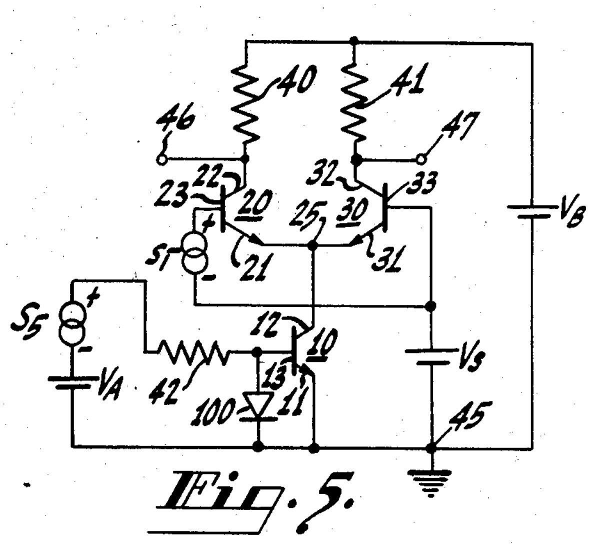
FIG. 5 shows a synchronous demodulator employing an input coupling transistor arranged as disclosed in U.S. Pat. No. 3,531,730 to provide base-emitter clamping and to exhibit characteristics resembling those of a common-base amplifier.

The arrangement of FIG. 5 utilizes a transistor having a grounded emitter electrode as in the FIG. 3 arrangement but which also exhibits characteristics comparable to the common base construction of FIG. 2. As will be seen, the arrangement of FIG. 5 employs an inverter stage of the type described in U. S. Pat. No. 3,531,730, and assigned to the same assignee as is this instant invention. In particular, the emitter electrode 11 of transistor 10 is directly connected to the reference potential point 45, while the collector electrode 12 is directly connected to the junction point 25 in much the same manner as with the FIG. 3 construction. A series coupling further exists between the reference point 45 and the base electrode 13 of transistor 10, including the energizing potential supply $V_A$, the signal source $S_5$ and the resistor 42. Base-to-emitter clamping at the transistor 10 is effected by a semiconductor rectifier 100 poled in the same direction as the base-emitter junction of transistor 10, and coupled with its anode electrode at the base electrode 13 and with its cathode electrode at the reference point 45.

In operation, positive-going input signals applied to the base electrode 13 of transistor 10 can produce increasing current flows in the transistor 10 in much the same manner as negative-going signals applied to the emitter electrode 11 of the transistor 10 shown in FIG. 2. Similarly, negative-going signals applied to the base electrode 13 in FIG. 5 can produce comparable decreasing current flows as positive-going signals applied to the emitter electrode 11 of the FIG. 2 combination. The advantage of the FIG. 5 arrangement over that shown in FIG. 3 is that, in an integrated circuit construction, the arrangement permits the exhibiting of gain characteristics substantially independent of the forward gain of transistor 10, and dependent primarily upon the relative areas of the base-emitter junction of transistor 10 and a junction of rectifier 100. Thus, the areas employed for the base emitter junction of transistor 10 and for the semiconductor rectifier 100 can be selected to provide a unity gain characteristic much the same as a common base amplifier; the configuration thus operates substantially independent of forward current gain which, in some instances, has been noted to change with component manufacturing variations to upset the operation of a construction such as shown in FIG. 3. With the arrangement of FIG. 5, on the other hand, the operation exists substantially independent of temperature changes as well as manufacturing variations and the clamping of the base-emitter junction of transistor 10 serves to limit the forward biasing of the base-collector junction and to inhibit the reverse bias of the switching transistors 20 and 30. Such arrangement, therefore, is effectively analagous to a common-base mode of operation "folded around" ground potential—however, offering inverted signal gain rather than non-inverted signal gain and being capable of being biased so that all of the electrodes of the arrangement operate close to ground potential.

The resistors 40–42 may each be connected external to an integrated circuit chip so that, as with FIG. 2, no additional terminals are necessary to introduce input signals to the demodulator for detection. Resistor 42 may further be selected of a value to give acceptable linear operation (as in the FIG. 1 manner), but offers the additional advantage that its use does not inhibit the available magnitude of the output signal swing as in that first construction. Here, also, it will be noted that the value of the potential supply $V_S$ is preferably selected to be slightly larger than—but not too much larger than—$2V_{BE}$ volts, to provide adequate bias voltage for the switching transistors but not so much as would inhibit the output voltage swing at the terminals 46 and 47. Even with such small values of $V_S$ bias voltage, the reverse biasing of the switching transistors is reduced so that no resulting d-c shift will occur at the output for input signals of such magnitude as tend to overdrive the input amplifier. As previously noted, such large input signals may be caused by incorrect gain control adjustments by the viewer, by signal fade or similar vagaries of burst signal reception or by mistuning in a receiver system for that matter.

While there have been described what are considered to be preferred arrangements for stabilizing detector output voltages in the presence of overdriven input signals, it will be readily apparent that other modifications can be made without departing from the teachings herein. Thus, while push-pull detector output signals may be provided in each instance using the NPN type of transistor circuitry described, similar arrangements can be had for PNP transistors as well, making appropriate voltage and polarity changes as are necessary. In such arrangements, it will be appreciated that one mode of coupling input signals to the amplifier transistor 10 of FIGS. 2 and 5 is by means of a coupling capacitor driven by an emitter follower transistor, for example. Similarly, one possible coupling to the transistor 10 of FIG. 3 might be by way of a high resistance element coupled together with the base emitter junction of transistor 10 in parallel with a band shaping tank circuit. In each instance, however, it will be seen that low voltage biasing of the switching transistor stage is employed without the problem of reverse-biasing its transistors for large input signal swings. As described, this makes possible the development of large output signals from the detector at a stabilized direct voltage, and with such potential sources as keep power dissipation to an acceptable value for integrated circuit use. As will also be apparent, a further modification of the described arrangement makes possible the use of the circuit in its multiplying mode, by utilizing sine wave signals, for example, to effectively multiply with the input carrier instead of to switch that signal either to one or the other of the detector terminals illustrated.

What is claimed is:

1. In a detector for recovering the information content of a modulated input signal and of the type including a switching section formed from two transistors having a pair of base electrodes biased to a predetermined potential level by one terminal of a first source of energizing potential and between which reference carrier switching signals are applied, a pair of collector electrodes to provide demodulated output signals representative of said information content and at which a direct voltage output of the detector is developed, and a pair of emitter electrodes commonly coupled to receive an intermediate signal corresponding to said modulated input signal from the collector electrode of an included amplifier transistor to which said input signal is applied, the improvement comprising:

means interconnecting the base and emitter electrodes of said amplifier transistor in a common base circuit configuration with a source supplying said modulated input signals and with a second source of energizing potential of lesser voltage value than that of said first source of energizing potential to inhibit such forward biasing of the base-collector junction of said amplifier transistor by said input signals as would cause reverse biasing of the base-emitter junction of both of said switching transistors and an undesirable shift in the direct voltage output of said detector; said means including:

a. a first resistance means coupling a first terminal of said source of modulated input signals to the emitter electrode of said amplifier transistor for applying input signals thereto;

b. direct current means coupling a first terminal of said second source of energizing potential to the base electrode of said amplifier transistor and maintaining a substantially fixed potential thereon;

c. direct current means coupling a second terminal of said source of modulated input signals, a second terminal of said first source of energizing potential, and a second terminal of said second source of energizing potential to a circuit junction point; and d. means coupling said junction point to a point of reference potential such that input signals are applied to said amplifier transistor between its emitter and base electrodes, output signals are developed by said transistor between its collector and base electrodes for coupling to said switching section transistor emitter electrodes, and the potential at the collector electrode of said amplifier transistor is effectively clamped with respect to said reference potential with supplied input signals of increasing magnitudes at substantially the voltage value of said second source of energizing potential.

2. The improvement of claim 1 wherein said amplifier transistor and said switching section transistors each exhibit a characteristic base-to-emitter offset voltage when in a conductive condition and wherein the voltage value of said first source of energizing potential exceeds the voltage value of said second source of energizing potential by an amount substantially equal to an order of magnitude of the base-to-emitter offset voltage of said switching section transistors, with all voltage values being measured with respect to the voltage value of said point of reference potential.

3. The improvement of claim 2 wherein the voltage value of said first source of energizing potential exceeds the voltage value of said point of reference potential by an amount substantially equal to an order of magnitude of the base-to-emitter offset voltage of said amplifier transistor.

4. The improvement of claim 3 wherein said source of modulated input signals supplies alternating signals to the emitter electrode of said amplifier transistor which modulate the current flow through the collector-emitter path of said transistor, and wherein the voltage value of said second source of energizing potential is selected with respect to the voltage value of said point of reference potential so as to inhibit the forward biasing of the base-collector junction of said amplifier transistor even in the presence of large magnitude current flows within said transistor.

5. An electrical circuit comprising:

first, second, and third transistors;

first, second, and third sources of energizing potential;

first and second resistors respectively coupling the collector electrodes of said first and second transistors to said first source of energizing potential;

a direct current connection from the emitter electrode of said first transistor to the emitter electrode of said second transistor;

a direct current connection from the emitter electrode of said first transistor to the collector electrode of said third transistor;

a direct current connection from the base electrode of said third transistor to said third source of energizing potential;

means supplying switching signals of the same frequency between the base electrodes of said first and second transistors;

means coupling said second source of energizing potential to the base electrodes of said first and second transistors;

a source of input signals having first and second terminals;

a third resistor coupling one terminal of said source of input signals to the emitter electrode of said third transistor; and a direct current connection from the second terminal of said signal source to a point of reference potential to which said first, second and third sources of energizing potential are also respectively referenced;

whereby, when said source of input signals supplies information containing voltage signals to the emitter electrode of said third transistor and said means supplies switching signals to the base electrodes of said first and second transistors, demodulated output signals are developed at the collector electrodes of said first and second transistors referenced to a direct voltage which remains substantially constant for large magnitude input signals when the voltage value of said second source of energizing potential exceeds the voltage value of said third source of energizing potential by an amount substantially equal to an order of magnitude of the base-to-emitter offset voltage of said first and second transistors and the voltage value of said third source of energizing potential exceeds the voltage value of said point of reference potential by an amount substantially equal to an order of magnitude of the base-to-emitter offset voltage of said third transistor.

6. In an apparatus of the type including a first section formed from two transistors having a pair of base electrodes biased to a predetermined potential level by one terminal of a first source of energizing potential and between which first signals are applied, a pair of collector electrodes to provide output signals dependent upon said first signals and at which a direct voltage output of the apparatus is developed, and a pair of emitter electrodes commonly coupled to receive an intermediate signal corresponding to an input signal applied to said apparatus coupled from the collector electrode of an included amplifier transistor to which said input signal is applied, the improvement comprising:

means interconnecting the base and emitter electrodes of said amplifier transistor in a common base circuit configuration with said source of input signals and with a second source of energizing potential of lesser voltage value than that of said first source of energizing potential to inhibit such forward biasing of the base-collector junction of said amplifier transistor by said input signals as would cause reverse biasing of the base-emitter junction of both of said first section transistors and an undesirable shift in the direct voltage output of said apparatus; said means including:

a. a first resistance means coupling a first terminal of said source of input signals to the emitter electrode of said amplifier transistor for applying input signals thereto;

b. direct current means053of said second source of energizing potential to the base electrode of said amplifier transistor and maintaining a substantially fixed potential thereon;

c. direct current means coupling a second terminal of said source of input signals, a second terminal of said first source of energizing potential, and a second terminal of said second source of energizing potential to a circuit junction point; and d. means coupling said junction point to a point of reference potential such that input signals are applied to said amplifier transistor between its emitter and base electrodes, output signals are developed by said transistor between its collector and base electrode for coupling to said first section transistor emitter electrodes, and the potential at the collector electrode of said amplifier transistor is effectively clamped with respect to said reference potential with supplied input signals of increasing magnitudes at substantially the voltage value of said second source of energizing potential.

* * * * *

UNITED STATES PATENT OFFICE
CERTIFICATE OF CORRECTION

Patent No. 3,673,505 Dated June 27, 1972

Inventor(s) Allen LeRoy Limberg

It is certified that error appears in the above-identified patent and that said Letters Patent are hereby corrected as shown below:

IN THE TITLE:

"SYNCHRONOUS DEMODULATOR EMPLOYING A COMMON-BASE TRANSISTOR AMPLIFIER" should read -- SYNCHRONOUS DEMODULATOR EMPLOYING A COMMON-BASE TRANSISTOR AMPLIFIER INPUT --.

IN THE SPECIFICATION:

Column 10, Line 19 - after "means" delete "053 of said" and insert -- coupling a first terminal of said --.

Signed and sealed this 9th day of January 1973.

(SEAL)
Attest:

EDWARD M. FLETCHER, JR.
Attesting Officer

ROBERT GOTTSCHALK
Commissioner of Patents

M PO-1050 (10-69)
) 6|72

USCOMM-DC 60376-P69
☆ U S GOVERNMENT PRINTING OFFICE 1969 O—366-334